May 29, 1962 R. C. INGRAHAM 3,036,937
METHOD FOR MANUFACTURING ALLOYED JUNCTION SEMICONDUCTOR DEVICES
Filed Dec. 26, 1957 6 Sheets-Sheet 1

INVENTOR.
ROBERT C. INGRAHAM
BY Elmer J. Nealon
ATT'Y.

INVENTOR.
ROBERT C. INGRAHAM
BY Elmer J. Nealon
ATT'Y.

INVENTOR.
ROBERT C. INGRAHAM
BY Elmer J. Nealon
ATT'Y.

May 29, 1962 R. C. INGRAHAM 3,036,937

METHOD FOR MANUFACTURING ALLOYED JUNCTION SEMICONDUCTOR DEVICES

Filed Dec. 26, 1957 6 Sheets-Sheet 4

INVENTOR.
ROBERT C. INGRAHAM
BY Elmer J. Nealon
ATT'Y.

INVENTOR.
ROBERT C. INGRAHAM
BY Elmer J. Nealon
ATT'Y.

May 29, 1962

R. C. INGRAHAM 3,036,937

METHOD FOR MANUFACTURING ALLOYED JUNCTION SEMICONDUCTOR DEVICES

Filed Dec. 26, 1957

6 Sheets-Sheet 6

INVENTOR.
ROBERT C. INGRAHAM
BY Elmer J. Nealon
ATT'Y.

United States Patent Office 3,036,937

Patented May 29, 1962

3,036,937

METHOD FOR MANUFACTURING ALLOYED JUNCTION SEMICONDUCTOR DEVICES

Robert C. Ingraham, Topsfield, Mass., assignor, by mesne assignments, to Sylvania Electric Products Inc., Wilmington, Del., a corporation of Delaware Filed Dec. 26, 1957, Ser. No. 705,397
1 Claim. (Cl. 148—1.5)

This invention relates to electrical translating devices, and more particularly to methods and apparatus for forming alloyed rectifying junctions in semiconductor devices.

As the semiconductor art has grown, various techniques for obtaining P-N rectifying barriers or junctions in semiconductor materials have been developed. Of these techniques, those involving the formation of alloy rectifying junctions are widely used on a commercial scale. These so-called "alloy junction" methods in general utilize a die or chip of a monocrystalline semiconductor of one conductivity type. A quantity of a material capable of imparting the opposite type of conductivity to the semiconductor is placed in contact with a surface of the semiconductor die. Sufficient heat is then applied for a suitable period of time to cause alloying of the conductivity imparting material with the semiconductor. The depth to which the alloying extends determines the region of conversion of the semiconductor die to the opposite type of conductivity and establishes the location of the P-N barrier. Following appropriate cleaning and etching steps the semiconductor die exhibits rectification phenomenon across this P-N barrier.

Although the basic principles involved in obtaining alloyed junctions in semiconductors appear relatively uncomplicated, the application of these principles of the large scale, low-cost production of transistors and other types of semiconductor devices is not without problems. This will be apparent from the following more detailed discussion of techniques which are currently in use and others which have been proposed.

An example of a production technique presently employed in obtaining alloyed rectifying junctions in semiconductor bodies is the so-called boat alloying method. The semiconductor material is processed by known techniques to obtain semiconductor bodies or dice of a desired conductivity type and of approximately the proper size for incorporation in the final device. These dice are suitably cleaned and etched to be free of contaminants and of precise thickness. Dots or pellets of electrode material capable of alloying with the semiconductor material and of imparting thereto a conductivity type opposite to that of the dice are prepared for subsequent application to the dice. These pellets are commonly cylindrical in shape and must be carefully prepared to assure that they are of the proper volume and are clean and free of contaminants.

In the manufacture of transistors, each semiconductor die together with one pellet to form the emitter electrode and another pellet to form the collector electrode is placed in position in a graphite alloying boat or crucible. One pellet is placed in a recess in the boat and a semiconductor die is placed on top of it. A second pellet is then placed on the semiconductor die and is surrounded by a hollow cylindrical insert of graphite. The configurations of recess, graphite cylinder, and associated portions of the boat are such as to position and confine the various working elements of the transistor as the pellets melt and alloy into the die. For this reason, the boats and cylinders must be carefully machined and maintained to close tolerances. The boats, each of which may be designed to handle a number of devices, must be loaded by hand, since, due to the small size and fragility of the parts involved, mechanization of such a step is presently uneconomical.

The loaded boats are placed in a hydrogen alloying furnace and are heated at a temperature and for a time which are calculated from known data to obtain alloying of the electrode material to a desired depth into the semiconductor body. The hydrogen atmosphere serves to reduce any oxides on the surfaces of the semiconductor die or on the junction forming pellets and thus more readily permits the junction forming material to wet and alloy with the semiconductor. After this alloying step which forms the P-N barriers in the semiconductor body, the device is further processed through any combination of various known annealing, etching, cleaning, and other steps before and after leads are attached to the electrodes and the body of the device. The assembled working elements of the device may then be packaged to form the finished transistor.

As is apparent from the foregoing discussion, the boat alloying method as it is generally employed is a batch type of process involving hand operations which are difficult to mechanize. The boats must be loaded and unloaded by hand, involving the possibilities of human error and carelessness as well as permitting exposure to contaminants. The process requires accurately machined graphite boats and inserts which are expensive to fabricate, must constantly be replaced, and are a source of contaminants if not properly cleaned before each use. These factors tend to affect the area of alloying and the depth of penetration of the alloying material and thus the location of the P-N barrier and the electrical charteristics of the device. One very important factor which is difficult to optimize in this process is cleanliness, particularly in the contact area between the die and the pellet. If the pellet is cleaned after its fabrication and prior to alloying, care must be taken to control any change in dimensions since the area and volume of the pellets are important to the ultimate characteristics of the device. The presence of a particle of dirt or a partially oxidized surface in the region of contact of the pellet and die may cause uneven alloying and thus an uneven or discontinuous P-N junction. The presence of hydrogen tends to reduce oxides and thus provides good alloying conditions. However, the contact region which is the region requiring cleaning by reduction is masked by the parts themselves. In addition, if for some reason the parts of the boat do not properly confine the molten alloy material, the hydrogen cleans up adjacent surfaces and the alloyed area spreads out of control. All these factors tend to reduce the yield of units which have uniform, smooth, flat junctions parallel to and at the desired distance from the surfaces of the semiconductor body.

The difficulties inherent in the above or similar techniques for mass producing alloyed junction devices have induced proposals of various methods which theoretically offer improvements. Many of these schemes require individual handling of dice or other small parts such as in masking areas of the dice, and thus offer no solution to the basic need of a more economical method. Other methods which have eliminated the problems inherent in providing individually fabricated pellets appear to offer more promise as a possible future technique. One of these methods involves the feeding of rods or wires of junction forming or electrode material against a succession of heated semiconductor dice. Still other methods involve maintaining a reservoir of junction forming material in molten form and depositing globules of this molten material on the semiconductor dice. While these methods appear to overcome many of the shortcomings of the boat alloying technique discussed above and seem amenable to economical mass production techniques, to my knowledge none has acquired any commercial significance. This lack of practical utility is due to the fact that although these methods might be utilized to produce devices having operable rectifying barriers therein, they cannot be used presently to fabricate large quantities of identical, uniform devices having specific predetermined parameters within the desired limits of reproducibility. The literature concerning these methods lacks teachings on how to assure that the same quantity of junction forming material will be applied to each semiconductor die, that the same area will be wetted on each die, that the surfaces will remain clean for the necessary wetting and alloying without permitting the wetted region to spread beyond the desired area, and that all wetting takes place at one time thus insuring flat, planar junctions. Thus, since there is no provision for controlling the factors essential to the manufacture of uniform devices with reproducible electrical parameters, these methods have remained in the laboratory leaving unanswered the problems raised by mass production.

Therefore it is an object of my invention to provide an improved method of fabricating alloyed junction semiconductor devices.

It is also an object of my invention to provide a method for forming electrodes on semiconductor bodies.

It is another object of my invention to provide a method for producing alloyed junctions in semiconductor devices which method is amenable to mass production and mechanization.

It is also an object of my invention to provide a method and apparatus for depositing uniform quantities of junction forming materials on semiconductor surfaces.

It is a further object of my invention to provide a method for obtaining controlled, uniform wetting of semi-conductor surfaces by alloying materials.

It is a still further object of my invention to provide a method for alloying junction forming materials to semiconductor bodies which method assures maximum cleanliness of the junction forming materials.

It is another object of my invention to provide a method and apparatus for alloying junction forming material to semiconductor dice without requiring the use of accurately constructed graphite boats.

In accordance with the foregoing objects of my invention, I provide a method for fabricating alloyed junctions in semiconductors which utilizes junction forming or electrode material maintained as a molten mass within a vessel. Means are provided for extruding or ejecting a predetermined quantity of the molten material through an aperture in the vessel. The globule of molten material thus extruded is maintained as an extension of and in continuity with the molten mass within the chamber as a contact region of predetermined area is formed between the globule and the surface of a semiconductor body. I then raise the temperature of the semi-conductor body to obtain wetting of the semiconductor by the molten material. The continuity between the globule and the molten mass of electrode material within the vessel is then broken, and the globule of electrode material is alloyed with the semiconductor to the desired depth in a subsequent operation.

It is a feature of my invention to regulate the area of the alloyed region by the extent to which the globule is deformed or oblated between the surface of the semiconductor and the portion of the vessel adjacent the aperture.

It is another feature of my invention to apply the heat necessary to achieve wetting of the semiconductor by the electrode material to the semiconductor die after the contact area between the globule of the electrode material and the die has been established. By so doing I preclude the oxidation or contamination of the semiconductor surface in the contact area and thus obtain even, uniform wetting or preliminary alloying of the junction material at least sufficient to form a bond between the globule and the semiconductor body.

It is also a feature of my invention to perform the heating step in open air or other oxidizing atmosphere in order to cause oxidation of the semiconductor surface except in its region of contact with the junction material. This surface oxidation provides a non-wettable coating which inhibits further spreading of the molten junction forming material during the subsequent alloying step. Thus it is seen that the ultimate alloyed junction area is precisely determined during the carefully controlled wetting operation.

It is a further feature of my invention first to secure a bond between the junction forming material and the semiconductor die, and subsequently to alloy the assembled unit in a non-reducing or slightly oxidizing atmosphere to prevent premature cleanup of the semiconductor surface and possible spreading of the area to be alloyed.

A better understanding of my invention together with an appreciation of additional objects and features thereof may be obtained from the following detailed discussion and the accompanying drawings in which.

Figure 9:
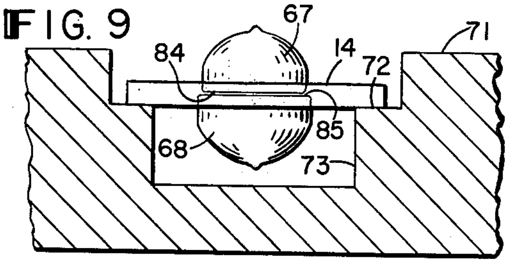
Figure 10:
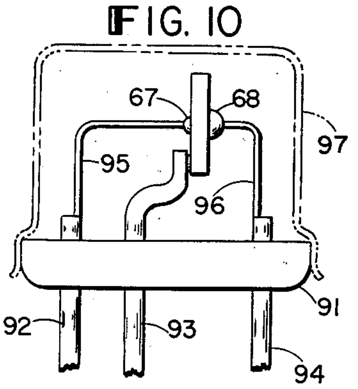
Figure 2:
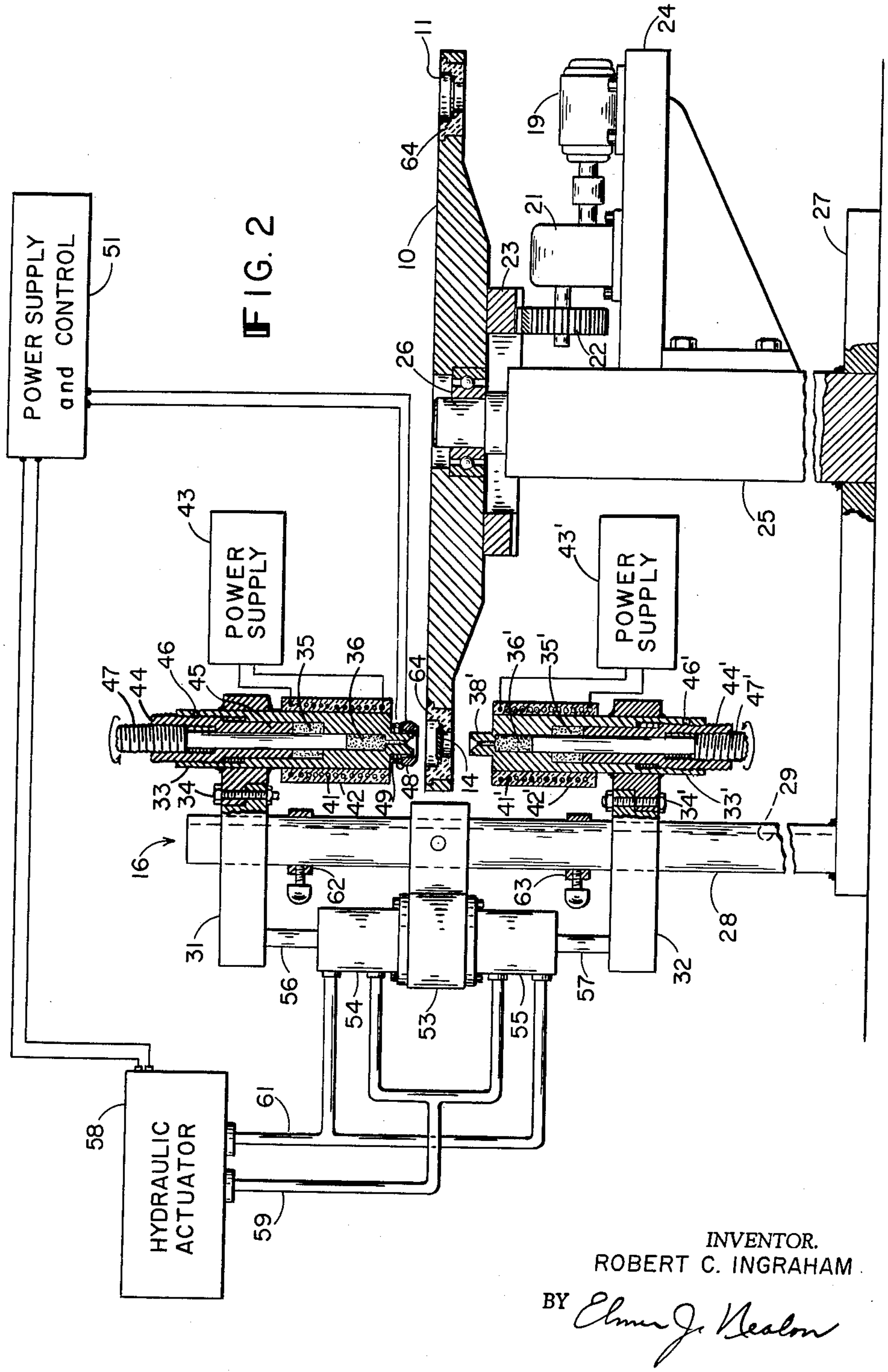
FIG. 2 is an elevational view partially in cross-section of the portion of the equipment shown schematically in FIG. 1 with which my invention is particularly concerned.
Figures 3, 4:
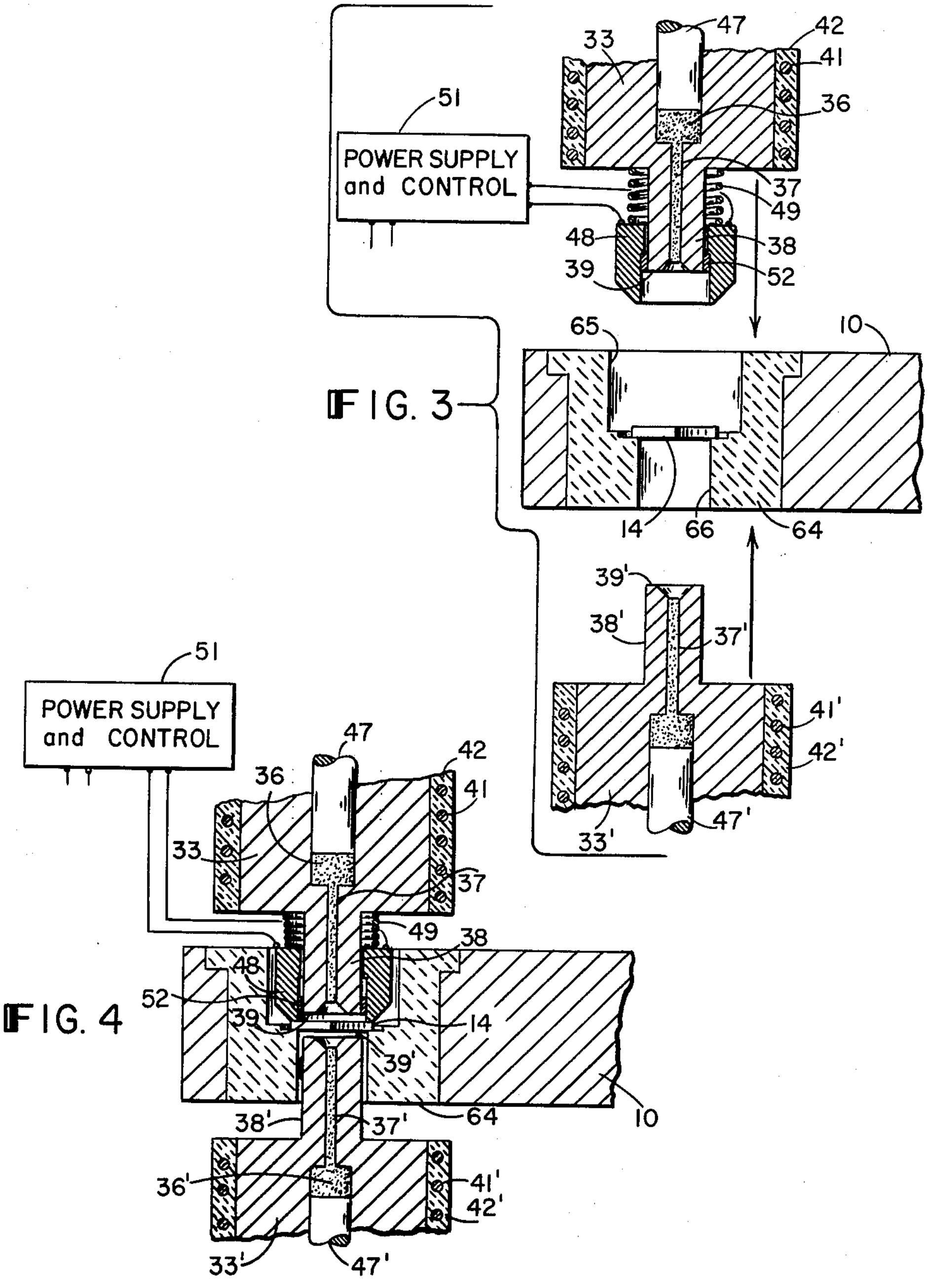
FIG. 3 is a greatly enlarged view showing certain details of the apparatus of FIG. 2 at one stage in the method of my invention.
Figure 4A:
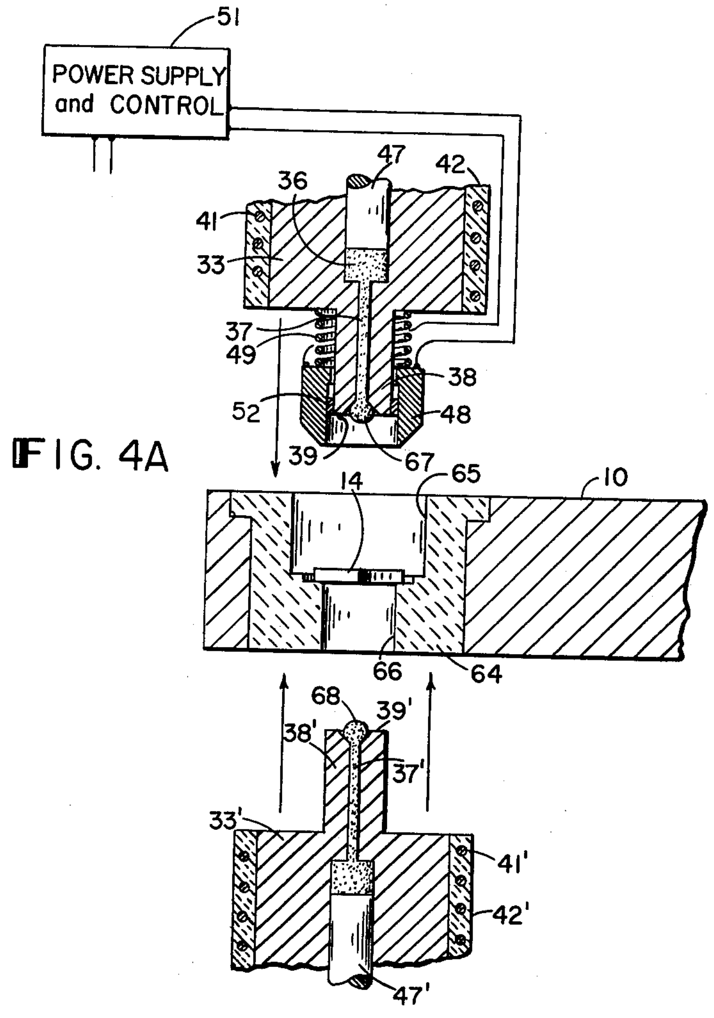
Figures 7, 8:
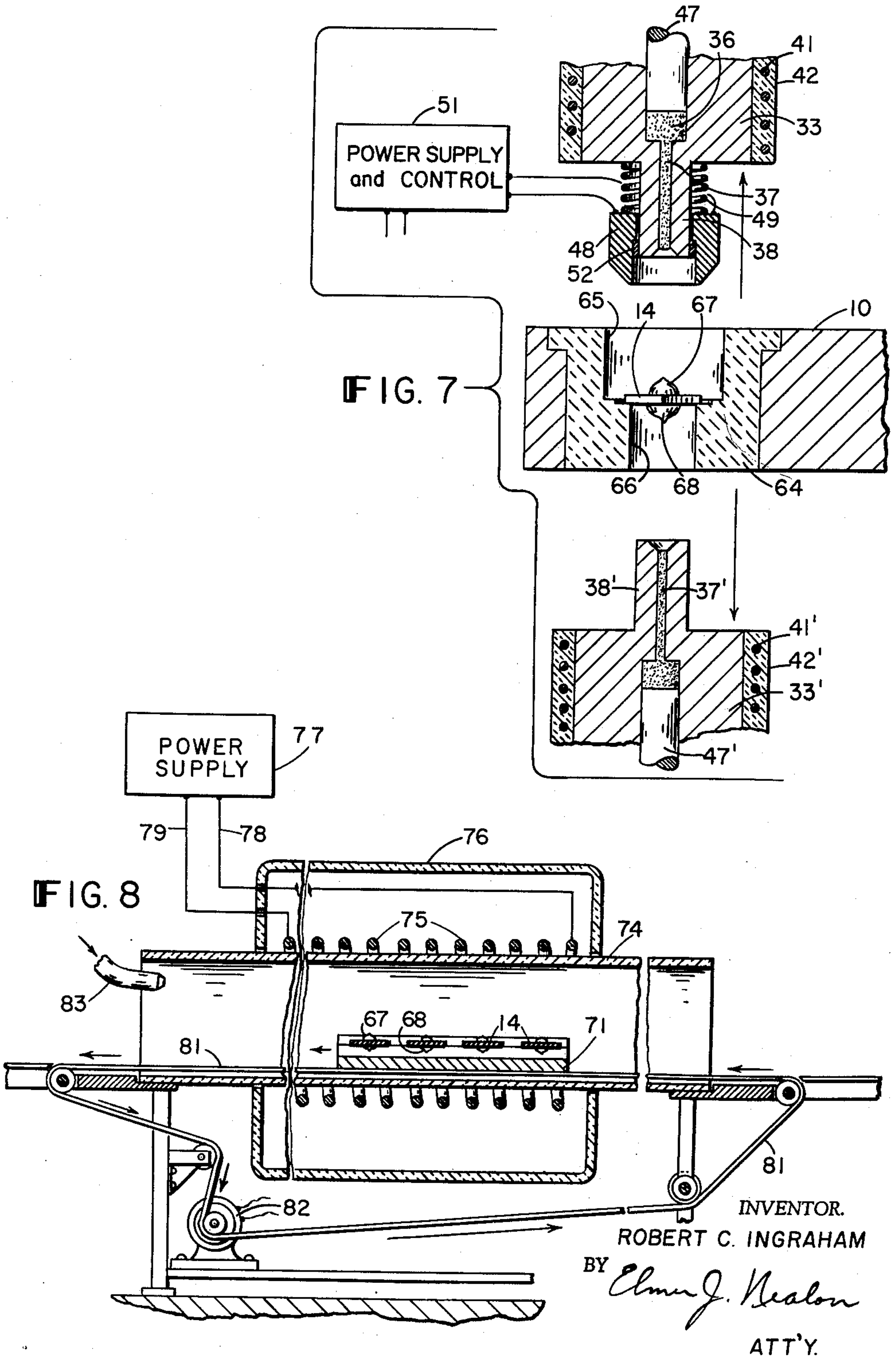

FIGS. 4, 5, 6, and 7 are views similar to that of FIG. 3 showing certain details of the apparatus of FIG. 2 at other stages in the method of my invention;

FIG. 4A is a greatly enlarged view showing certain details of the apparatus of FIG. 2 at one stage in a modification of the method of my invention;

FIG. 8 is an elevational view in cross-section of a furnace for alloying the dice with bonded pellets;

FIG. 9 is a representation of an alloyed semiconductor device in position on an alloying tray after alloying;

FIG. 10 is a view in elevation of a device fabricated by employing the method and apparatus to my invention and incorporated in a suitable package to form a completed transistor.

In considering the accompanying drawings it will be understood that by reason of the extremely small actual size of the semiconductor devices with which the invention is concerned, it has been necessary to show certain elements of the devices and certain portions of the apparatus disproportionate in size to related elements and portions.

Figure 1:
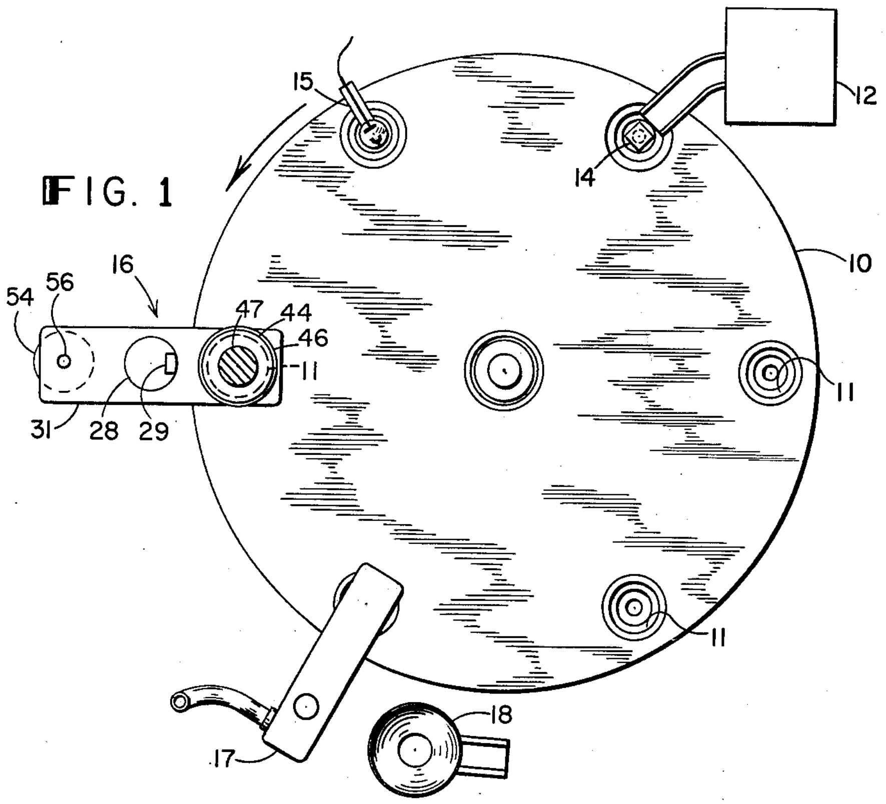
FIG. 1 is a schematic representation in plan view of equipment for bonding pellets to semiconductor dice according to the method of my invention.

In order to present the details of my invention so as to provide an understanding of its full significance and possibilities, I have chosen to describe my invention in conjunction with the equipment shown schematically in FIG. 1. This equipment includes a revolving turret 10 having a series of work positions 11 evenly spaced around the perimeter. The turret indexes periodically in a counterclockwise direction as shown in FIG. 1 to place each work position in succession at each of a number of work stations. At the first station a vibratory feeding device 12 containing a bulk supply of prepared semiconductor dice of uniform dimensions is provided. The feeding mechanism places one semiconductor die 14 in each of the work positions on the turret as the positions present themselves at this station. At the next station a photocell device 15 checks each work position to insure that a die is present. This information is relayed to the next succeeding station by a suitable means, not shown, to inactivate the station if no die is present when the work position is presented at that station. At this next station is provided apparatus 16 which applies pellets of junction forming or electrode material to the semiconductor die and bonds the pellets in position for subsequent alloying. It is in the method and apparatus for applying these pellets that important features of my invention reside. After pellets of junction forming material have been applied to the die, the turret indexes, moving the work position to the next work station where an unloading mechanism 17, which may be of the well-known vacuum pick-up type, unloads the assembled unit of die and pellets. The pick-up deposits the unit in hopper 18 which may lead to a storage bin or to a conveyor system for transporting the unit to the next manufacturing operation.

FIG. 2 shows in detail the apparatus 16 for applying pellets of junction forming or electrode material to the semi-conductor die or body and also shows certain other portions of the mechanism associated with the turret 10. The turret is driven by an electric motor 19 through an indexing mechanism 21 via suitable gears 22 and 23. The platform 24 for this drive mechanism is rigidly attached to a center post 25 about which the turret rotates on bearing 26. The center post is attached to a base plate 27 to which is rigidly fastened an upright supporting member 28 having a keyway 29. An upper supporting arm 31 and a lower arm 32 are slidably mounted on the vertical support and are prevented from rotating on the support by keys (not shown) riding in keyway 29. A cylindrical crucible 33 is removably mounted by means of bolt 34 on arm 31 and a similar cylindrical crucible 33′ is mounted in inverted position on arm 32. The crucibles or vessels are positioned so as to be coaxial with each other.

Since the structure of the two crucibles is identical in most respects, only the upper crucible 33 will be described in detail. Referring to FIGS. 3 through 7, as well as FIG. 2, crucible 33 encloses a first chamber 35 of relatively large cross-sectioned area, a second chamber 36 of smaller cross-sectioned area, and a narrow duct 37 which extends from the smaller chamber through a nozzle portion 38 of the crucible to an aperture in the lower face 39 of the nozzle. The face of the nozzle preferably is of conical contour flaring outwardly from the junction of the face surface with the wall surface of the duct. The walls of the crucible in the region of the two chambers are surrounded by a heating coil 41 embedded in an insulating jacket 42. The coil is resistance heated by an electric current from a power supply 43. The heat serves to maintain the contents of the vessel in molten condition at the desired temperature. A bushing 44 having a threaded portion mating with internal threads on the wall surfaces of the larger chamber has a portion 45 which fits snugly within the unthreaded portion of the chamber. The volume within the larger chamber can thus be varied by screwing the bushing in or out. The bushing is locked in any desired position by a set screw 46. The internal diameter of the bushing is of substantially the same diameter as the diameter of the smaller chamber 36. The upper end of the bushing is threaded internally to mate with the threads on the upper end of rod or plunger 47. The unthreaded portion of the rod fits snugly within the bushing and within the smaller chamber 36, thus serving as a closure for the smaller chamber, sealing it off from the larger chamber. Rotation of the rod serves to vary the volume within the smaller chamber.

The lower crucible 33′ is identical with the upper crucible 33 in all particulars thus far described. Throughout the text wherever it is necessary to refer to parts of the lower crucible 33′ they are numbered the same as corresponding parts of the upper crucible with a prime notation added.

The upper crucible has a ring shaped member 48 which serves as a heater and a hold-down device for the semi-conductor die. This member is biased downward, away from the crucible, by means of a compression spring 49. The heater ring is resistance heated by electrical current supplied by a suitable power supply included in the power supply and control system 51 shown schematically in the drawing. A retaining ring 52 at the lower end of the nozzle serves as a stop to limit downward motion of the heater member with respect to the crucible. The outer surfaces of the nozzle and retaining ring are sprayed with a ceramic coating (not shown) to prevent shorting out of the heater ring.

Additional portions of the apparatus 16 which include mechanism for moving the crucibles in and out of position as well as means for limiting the extent of their movement are shown in FIG. 2. A support arm 53 is rigidly attached to the upright supporting member 28. Two hydraulically operated cylinders 54 and 55 which are mounted on the support arm have piston rods 56 and 57 connected to the crucible support arms 31 and 32 respectively. Hydraulic fluid is forced by an electrically energized actuator 58 via hydraulic lines 59 and 61 into the cylinders in order to move the piston rods and thus the crucibles toward and away from each other. An adjustable stop 62 is set to limit the downward movement of the upper crucible 33, and another adjustable stop 63 is set to limit the upward movement of the lower crucible 33′. The hydraulic actuator is controlled electrically by means of signals from the power supply and control unit.

The details of a work position 11 of the turret 10 are best shown in FIGS. 3 through 7. A ceramic insert 64 is seated in a stepped recess at each work position. The insert has a cavity 65 of sufficient diameter to receive the nozzle 38 and the heating and hold-down member 48. An opening 66 is provided in the bottom of the insert to accommodate the nozzle 38′ of the lower crucible. A step is provided in the floor of the cavity to support and position the semiconductor die. Preferably this step defines a circular depression of depth slightly less than the thickness of the die and of such diameter as to prevent lateral movement of the die.

Operation of the apparatus shown and described in carrying out the method of my invention can best be understood from the detailed drawings 3 through 7 with occasional reference to FIG. 2 wherein certain of the operating elements of the apparatus are shown. The crucibles 33 and 33′ are first demounted from the apparatus and filled with charges of molten junction forming material which is maintained molten by the heating coils 41 and 41′. The diameters of the apertures at the ends of ducts 37 and 37′ are sufficiently small so that surface tension of the molten electrode material prevents flow of the material therethrough. The bushings 44 and 44′ for the crucibles are threaded into position and adjusted so that all gases are expelled from the crucibles and only molten electrode material is extruded at the respective apertures. The bushings are then locked in position by set screws 46 and 46′. During this adjustment, the rods or pistons 47 and 47′ are in position in the bushings, but are retracted so that they will not extend into the smaller chambers of the crucibles. Each rod is then rotated until it enters the small chamber and seals the smaller chamber from the larger chamber. Subsequent rotation of the rod through a predetermined angle moves a precise predetermined volume of the rod into the smaller chamber and by displacement causes a globule of molten electrode material of the same volume to be extruded through the orifice. By using the double chamber arrangement, it is possible to maintain a fairly large reservoir of molten material while operating on only a small portion of the material at a time. By working with only a small volume at a time the various factors causing contraction and expansion of the molten material have less total effect, and precise control of the volume of the globules extruded through the opening is maintained more readily. Upon near depletion of the molten material within the smaller chamber, the rod or plunger is rotated to retract it into the larger chamber, and the bushing is released from its locked position and turned until molten electrode material appears at the orifice. The bushing is then locked in position and the plunger is rotated until it seals off the smaller chamber from the larger chamber. This recharging of the smaller chamber from the larger chamber may be carried out while the crucible remains mounted in position on the apparatus. Since the quantity of junction forming material extruded on each die is extremely small in comparison with the quantity of material in the larger chamber, it is possible to operate the apparatus for a long period without substantial interruption.

After the crucibles have been properly filled, adjusted, and mounted in position a quantity of semiconductor bodies or dice are placed in random arrangement in the vibratory feeder 12 shown in FIG. 1. A die 14 is fed into a work position 11, and as the turret revolves the die arrives in position for the pellets to be applied as best shown in FIG. 3. The hydraulic actuator 58 is then energized, thereby operating the hydraulic cylinders 54 and 55 to move the crucibles 33 and 33′ toward each other and into position as shown in FIG. 4. The extent of their movement is limited by the stops 62 and 63 which are preset to provide accurately predetermined distances between the opposed surfaces of the semiconductor die 14 and the faces 39 and 39′ of the nozzles. With the upper crucible 33 in this position the heating and hold-down ring 48 presses firmly against the die due to the action of compression spring 49. As may be noted from FIG. 4 the hold-down member engages the die 14 in the region directly over the portion of the insert on which the die rests to that no unnecessary shearing stress is placed on the fragile die.

Figure 5:
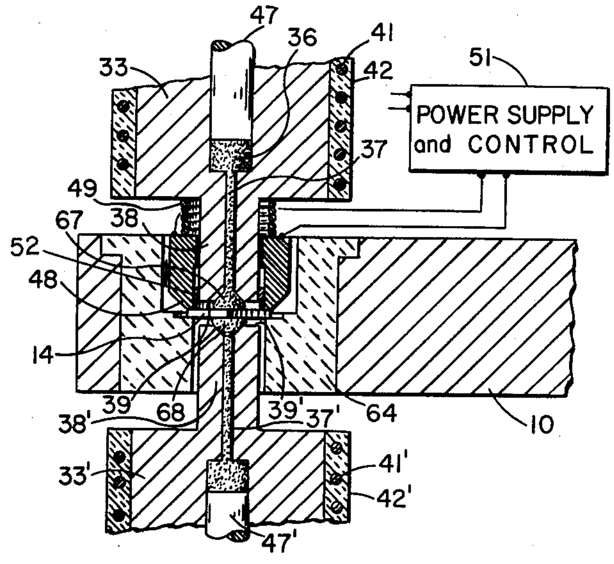

With the crucibles in position, pistons 47 and 47′ are each rotated a precise amount to extrude through the apertures in the nozzle faces 39 and 39′ accurately predetermined quantities of molten junction forming material as shown in FIG. 5. The molten material extruded forms globules 67 and 68 which contact and are confined between the faces of the nozzles and the upper and lower surfaces respectively of the die 14. The globules which, due to the force of surface tension, tend to form into spherical drops are thus deformed from spherical contour into the oblated spherical shapes shown in FIG. 5. Since all the globules extruded from each crucible can be controlled so as to have the same volume and since the distance between each nozzle surface and each die surface is always the same, a uniform predetermined area of contact between the globules of electrode material and the semiconductor surfaces is obtained consistently.

When the predetermined areas of contact between the die and the globules of junction forming material have been established by virtue of the positions of the crucibles with respect to the die, as shown in FIG. 5, an electric current from the power supply and control unit is supplied to heater member 48. As the temperature of the semiconductor body is raised by the heater the globules 67 and 68 of junction forming material wet the semiconductor surfaces and start the preliminary stages of alloying. During this period the surfaces of the semiconductor die in the regions outside the areas of contact with the globules become oxidized by exposure to the air at the elevated wetting temperature. Since the globules are placed in contact with the die before the temperatures of the die is raised and while the semiconductor surface is clean and free of oxide, wetting of the die takes place uniformly in the area of contact and this area is effectively masked from oxidation at the subsequently elevated temperature. The oxide coating inhibits wetting and spreading of the globules beyond more than a very small, predictable region outside the original area of contact. Heat is supplied for a preset time to permit the globules to bond satisfactorily to the die and is turned off automatically by the control unit.

The time and temperature of heating subsequent to application of the globules to the die are, of course, dependent on the particular semiconductor and alloy junction forming materials employed. Wetting of the die by the globules can be accomplished within the range of temperatures between the melting points of the junction forming material and the semiconductor material. However, I have found that from the standpoints of quality of product and simplicity of operation, temperatures which permit wetting and bonding of the globules to the die in about 5 to 15 seconds are preferred.

Figure 6:
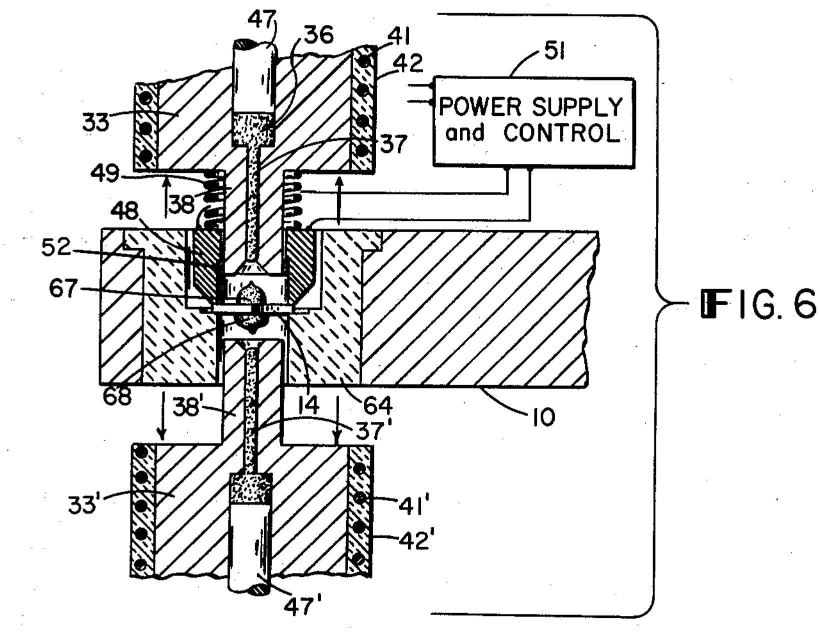

After the bond has been established between the die and the junction forming material a signal is supplied by the control unit to the hydraulic actuator and the hydraulic cylinders 54 and 55 operate to move the crucibles apart. Simultaneously with, or slightly before or after the start of movement of the crucibles away from the die, the current supplied to the heater is discontinued. Contact between the molten globules and the masses of molten material within the crucibles is broken as shown in FIG. 6. A meniscus across the orifice of each nozzle is established by the surface tension of the molten junction-forming material. With a suitable choice of aperture diameter any variation in the volume of successively extruded globules by virtue of different positions of the meniscus is insignificant. The globules which are bonded to the semiconductor surface tend to become peaked as the nozzles are pulled away. It is to be noted that the surface tension of the molten material may tend to lift the die from its position during this operation. However, sufficient lost motion is provided between the crucible nozzle and the hold-down member 48 so that pressure is applied by this member through spring 49 until after the globule is separated from the molten material at the nozzle orifice. FIG. 6 shows the position of the apparatus after separation has occurred and while the hold-down member still presses the die against the ceramic insert 64. If it is considered desirable, the heat need not be turned off as indicated above, but may continue to be applied to the die as the nozzles are pulled away from the globules, or the heat may be turned off and then reapplied to the die while the apparatus is maintained for a period in the position shown in FIG. 6.

FIG. 7 shows the apparatus in its fully retracted position with the bonding steps completed. The die with attached globules cools rapidly so that the globules solidify and the assembly of die and electrodes is ready to be advanced to the unloading station.

An alternate method of carrying out my invention and involving a slightly different sequence of steps is possible employing the same apparatus. With the semiconductor body 14 in position as shown in FIG. 3, rods 47 and 47′ are rotated to extrude precise quantities of molten electrode material. Surface tension holds the molten material in spherical globules 67 and 68 in the positions shown in FIG. 4A. The hydraulic actuator 58 is then energized to move the crucibles toward each other. As the crucibles come into the position determined by the stops 62 and 63, the globules are deformed between the faces 39 and 39′ of the nozzles and the surfaces of the die 14. The results obtained are as shown in FIG. 5. The heating current is then supplied to the heating member 48 and the cycle continues with the crucibles being retracted as shown in FIG. 6 and then further retracted as shown in FIG. 7. This alternate method differs from the one previously described in that the globules are first extruded and then oblated by the positioning of the nozzles, rather than being extruded and oblated after first positioning the nozzles.

With the crucibles in the retracted position shown in FIG. 7, the turret is ready to index. The assembled unit of die and solidified pellets of junction forming material is advanced to the unloading station as shown in FIG. 1. A vacuum unloading mechanism 17 takes the unit out of the work position on the turret and deposits it in a hopper 18 which may lead to a storage bin or to a conveyor system which transports the unit to the alloying operation.

In the alloying operation the assembled unit of die and pellets is placed in a tray 71 as shown in FIGS. 8 and 9. The tray has a shoulder 72 on which the die rests and a recess 73 to allow sufficient clearance for the lower pellet.

The tray may be of any suitable material such as stainless steel or carbon.

The tray bearing any desired number of assemblies of the working elements is then placed in an alloying furnace for a time and at a temperature to provide the desired depth of penetration or alloying of the junction forming material. The times and temperatures necessary to achieve the desired extent of alloying are well known to those familiar with this art.

One form of suitable alloying furnace is shown in FIG. 8. The furnace includes a cylindrical quartz tube 74 surrounded by a resistance heating coil 75. An outer jacket of heat insulating material 76 encloses the heating coil. The connection of a power supply 77 to the coil via wires 78 and 79 is shown schematically in the drawing. A conveyor belt 81 suitably driven by an electric motor 82 is provided for moving the alloying tray 71 through the furnace. A gas inlet 83 is placed at the exit end of the quartz tube to provide a flow-through atmosphere of an inert or slightly oxidizing gas.

Although hydrogen or other reducing atmospheres may be employed in the furnace, the previous steps of the process herein disclosed make it possible and, in general, desirable to use atmospheres which are inert or even oxidizing in nature. Reducing atmospheres tend to remove the oxides on the exposed semiconductor surfaces permitting the molten globules to spread and wet beyond the area which was obtained through careful control when the pellets were originally applied by the apparatus 16. With certain materials the alloying step may be carried out in open air but it may then be necessary to remove fairly heavy oxide layers before further processing. It is also possible to perform the alloying step while the unit remains in the position on the turret where the pellets are applied. This may be done by heating with heating ring 48 while the apparatus is in the position shown in FIG. 6. However, because of the time required for alloying, such a process normally is not an economical one, and I prefer only to bond the pellets to the die in the apparatus 16 and subsequently to alloy in a separate operation.

After alloying, the junction forming material of the pellets 67 and 68 has penetrated into the semiconductor to form P-N barriers 84 and 85 respectively as shown in FIG. 9. The barriers are parallel to the opposed semiconductor surfaces and thus to each other. Exceptionally high yields of such planar junctions are obtained because the original wetting action takes place simultaneously throughout the area of contact of globule and die which area corresponds to the predetermined junction area of the final device.

In further processing the alloyed unit, well known techniques of etching, cleaning, and various other fabricating steps are employed. The unit is then mounted in a standard package to provide a finished transistor as shown in FIG. 10. The package or enclosure includes a base member 91 through which are sealed three insulated leads 92, 93, and 94. Lead 93 is ohmically connected to the semiconductor body in an area removed from the pellets. Lead 92 is connected to pellet 67 via wire 95, and lead 94 is connected to pellet 68 via wire 96. After further cleaning and otherwise processing the mounted unit, a cover 97, indicated in phantom, is sealed to the base to complete the transistor.

In order to illustrate more clearly the operation and the utility of my apparatus and method, the fabrication of a particular P-N-P alloyed junction germanium transistor will be described in detail. A die of antimony doped, monocrystalline germanium of N-type conductivity and resistivity of 3 to 5 ohm-centimeters measuring .080 x .080 x .0045 inch is prepared employing techniques currently well known in the art. In order to obtain particular electrical characteristics in the final device it is necessary to alloy into this die a pellet of 98% indium, 1% gallium, and 1% silver having a volume equal to that of a sphere of .025 inch in diameter and having an alloyed area at the semiconductor surface of .031 inch in diameter to serve as the emitter. A pellet having a volume equal to that of a sphere of .031 inch in diameter and an alloyed area of .046 inch in diameter is required for the collector.

The body of each of the crucibles 33 and 33' is constructed of molybdenum, a material that is not wetted by molten indium. The diameters of the smaller chambers 36 and 36' of the crucibles are 1/16 inch and their volumes are such as to contain material for approximately 1000 pellets. In each of the crucibles, the diameter of the aperture in the nozzle face as well as that of the duct leading to the aperture is .006 inch. The surface of the nozzle face adjacent the orifice flares outwardly from the orifice at an angle of approximately 80° from the centerline of the duct. The depth of the conical impression in the face of the nozzle is about 0.010 inch. The electrode forming material is placed in both crucibles, which are otherwise readied for use in the manner described previously. After being filled, the crucibles are mounted in position on the apparatus 16 as shown in FIG. 2. The material within the crucibles is maintained at a temperature of approximately 260° C. The upper crucible 33 is used for applying the emitter electrode and the lower crucible 33' the collector electrode. The stops 62 and 63 which determine the distances between the nozzles and die surfaces are set so that globules of the required volume will produce contact areas of the above-indicated desired diameter.

With the crucibles in place in the apparatus, the germanium die is placed in position as in FIG. 3 and the crucibles are moved into position as shown in FIG. 4. Pistons 47 and 47' are rotated the proper amount to extrude by displacement globules of the molten indium alloy of the specific volumes indicated above. The globules are oblated as shown in FIG. 5. An electric current from the power supply and control unit 51 is then passed through the heating member 48 to raise the temperature of the die rapidly to a temperature of about 450° C. About 8 seconds is required for this heating operation. During this period the globules of junction forming material wet the semiconductor die as evidenced by the tendency for the peripheral portions of the globules to merge pependicularly with the surface of the die as shown in FIG. 6. Until such wetting is accomplished, the surface of the globule tends to merge with the die surface more tangentially as shown in FIG. 5. During the heating step the exposed sufaces of the germanium become slightly oxidized by the surrounding air. After the heat is turned off, and while the globules are still in molten form, the crucibles are retracted, thus separating the globules from the molten material within the crucibles. The globules quickly solidify into pellets which are bonded firmly to the germanium.

The assembled unit of germanium die and pellets is then alloyed in the alloying furnace shown in FIG. 8. Nitrogen flows through the furnace together with some air to provide a slightly oxidizing atmosphere. The units are alloyed at a temperature of about 550° C. for a period of 10 minutes. The atmosphere employed insures that the oxide coating remains on the exposed germanium surfaces preventing the molten junction forming material from spreading beyond the area it occupied prior to being placed in the alloying furnace. The indium mixture alloys with the germanium to convert a portion of the N-type material to P-type and thus form the P-N barriers constituting the emitter and collector junctions. Further processing of the alloyed unit is according to various well known techniques used in fabricating P-N-P transistors and discussed generally previously in this specification.

Although the discussion has been limited to certain specific semiconductor and electrode materials with the apparatus shown in order to carry out the preferred methods of my invention, my invention should not be considered as being limited thereby. I have described a specific embodiment of my invention in preparing a P-N-P transistor using an antimony doped germanium die and indium alloy as the junction forming material. However, the utility of the invention in fabricating other alloyed junction devices, for example, diodes or N-P-N transistors, is obvious. The teachings disclosed herein may also be utilized with other semiconductor materials, such as for example silicon, and with other suitable junction forming materials such as, for example, lead antimony alloy.

Variations in the apparatus likewise readily suggest themselves. Among these are possible alternative arrangements for heating the semiconductor die after application of the molten globules of electrode material thereto. Illustratively, RF induction heating devices of well known types could be substituted for the resistance heating element specifically described above. Furthermore it may be desirable to provide resistance heating in the support for the die in lieu of, or in addition to, the heating element shown. Still further, although I have described my invention by reference to a turret type machine, it is to be realized that other supporting and conveying arrangements such, as for example, belts and reciprocating slides also may be employed. Other possible variations in method and apparatus for carrying out my invention have been mentioned previously in this specification and still others will be obvious to those familiar with this art without the exercise of further invention.

I claim:

The method of making an electrical translating device having a semiconductor body of one conductivity type and an emitter and collector alloyed to opposed surfaces thereof, including the steps of maintaining in a first vessel a first molten mass of material capable of imparting the other type of conductivity to the semiconductor, maintaining a second molten mass of said material in a second vessel, each of said vessels having an aperture therein to permit extrusion of the material from the vessels, positioning the semiconductor body intermediate the apertures in said vessels, adjusting said vessels and said semiconductor body to obtain a predetermined distance between one of the opposed surfaces of said body and the aperture of said first vessel and to obtain another predetermined distance between the other of the opposed surfaces of said body and the aperture of said second vessel, extruding a first globule of a predetermined volume of molten material through the aperture of said first vessel and oblating said first globule between said first vessel and said one surface of said body thereby obtaining a predetermined area of contact between said first globule and said one surface, extruding a second globule of a predetermined volume of molten material through the aperture of said second vessel and oblating said second globule between said second vessel and said other surface of said body and thereby obtaining a predetermined area of contact between said second globule and said other surface, heating said semiconductor body in an oxidizing atmosphere to cause wetting of said semiconductor by said globules and oxidizing of said opposed surfaces of said semiconductor body except in said predetermined areas of contact, increasing the distances between said vessels and said semiconductor body to cause separation of said globules from the molten material within said vessels and permitting the globules to solidify, and subsequently heating said semiconductor body and solidified globules in a non-reducing atmosphere to alloy said globule material with said semiconductor body and to obtain conversion of portions of said body to the other type of conductivity.

References Cited in the file of this patent

UNITED STATES PATENTS

| | | |
|---|---|---|
| 2,715,252 | Schaeffer et al. | Aug. 16, 1955 |
| 2,791,524 | Ozarow | May 7, 1957 |
| 2,799,905 | Vieth | July 23, 1957 |
| 2,803,569 | Jacobs et al. | Aug. 20, 1957 |
| 2,805,968 | Dunn | Sept. 10, 1957 |
| 2,817,607 | Jenny | Dec. 24, 1957 |
| 2,825,667 | Mueller | Mar. 4, 1958 |
| 2,849,341 | Jenny | Aug. 26, 1958 |
| 2,850,413 | Schmich | Sept. 2, 1958 |
| 2,857,296 | Farris | Oct. 21, 1958 |
| 2,878,148 | Beale | Mar. 17, 1959 |
| 2,881,103 | Brand et al. | Apr. 7, 1959 |
| 2,887,415 | Stevenson | May 19, 1959 |
| 2,893,901 | Lehovec | July 7, 1959 |
| 2,906,930 | Raithel | Sept. 28, 1959 |
| 2,916,810 | Smith et al. | Dec. 15, 1959 |

FOREIGN PATENTS

| | | |
|---|---|---|
| 751,143 | Great Britain | June 27, 1956 |